(12) United States Patent
Duralek et al.

(10) Patent No.: US 11,864,365 B2
(45) Date of Patent: Jan. 2, 2024

(54) EMC HOUSING

(71) Applicant: APTIV TECHNOLOGIES LIMITED, St. Michael (BB)

(72) Inventors: Janusz Duralek, Skawina (PL); Krzysztof Adamczyk, Mała Wieś (PL)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 17/951,297

(22) Filed: Sep. 23, 2022

(65) Prior Publication Data

US 2023/0101552 A1  Mar. 30, 2023

(30) Foreign Application Priority Data

Sep. 30, 2021 (EP) .................................. 21200102

(51) Int. Cl.
*H05K 9/00* (2006.01)

(52) U.S. Cl.
CPC .................. *H05K 9/0015* (2013.01)

(58) Field of Classification Search
CPC ........................ H05K 9/0033; H05K 9/0015
See application file for complete search history.

(56) References Cited

U.S. PATENT DOCUMENTS

| | | | |
|---|---|---|---|
| 5,001,298 A * | 3/1991 | Jong | H05K 9/0073 174/372 |
| 5,880,930 A * | 3/1999 | Wheaton | H05K 9/0033 361/818 |
| 6,037,846 A | 3/2000 | Oberhammer | |
| 6,348,654 B1 | 2/2002 | Zhang et al. | |
| 6,521,828 B2 | 2/2003 | Ariel | |
| 7,375,291 B2 | 5/2008 | Ariel | |
| 7,687,725 B2 * | 3/2010 | Hogan | H05K 9/0009 174/382 |
| 7,910,839 B2 * | 3/2011 | Lynam | H05K 9/0009 174/384 |
| 8,921,710 B2 * | 12/2014 | Teo | H05K 9/0009 174/363 |
| 9,226,433 B2 | 12/2015 | Cook et al. | |
| 9,545,019 B2 * | 1/2017 | Ishikura | H05K 5/0004 |
| 10,170,898 B1 * | 1/2019 | Chung | H05K 9/0049 |
| 2001/0052521 A1 | 12/2001 | Goyal et al. | |

(Continued)

FOREIGN PATENT DOCUMENTS

EP  1325675 A2  7/2003

OTHER PUBLICATIONS

European Search Report issued by the European Patent Office in connection with International Patent Application No. 21200102.8, dated Mar. 16, 2022.

*Primary Examiner* — Hung V Ngo
(74) *Attorney, Agent, or Firm* — George Likourezos; Carter, DeLuca & Farrell LLP

(57) ABSTRACT

An electromagnetic compatibility (EMC) housing having a first part and a second part for forming an enclosure when fitted together. The first and second parts include first and second interface surfaces respectively, for compressing a gasket interposed between the interface surfaces when the first and second parts are fitted together. At least one of the first and second interface surfaces includes a plurality of undercut regions for reducing compression of the gasket in the region when the first and second parts are fitted together.

15 Claims, 3 Drawing Sheets

(56) References Cited

U.S. PATENT DOCUMENTS

| | | |
|---|---|---|
| 2013/0200768 A1 | 8/2013 | Miura et al. |
| 2014/0065877 A1* | 3/2014 | Ohhashi ............. H01R 13/5213 |
| | | 439/519 |
| 2014/0360772 A1* | 12/2014 | Coppola ................ F16J 15/064 |
| | | 174/390 |
| 2017/0374769 A1* | 12/2017 | Vehkapera ........... H05K 9/0024 |
| 2019/0090373 A1 | 3/2019 | Mizumoto et al. |
| 2020/0305290 A1* | 9/2020 | Ohashi ..................... H05K 5/03 |

* cited by examiner

EMC HOUSING

CROSS-REFERENCE TO RELATED APPLICATION

This application claims the benefit of European patent application serial number EP21200102.8 filed on Sep. 30, 2021. The entire contents of which are hereby incorporated by reference herein.

INTRODUCTION

The present disclosure relates to an electromagnetic compatibility (EMC) housing and an automotive electronics housing for electromagnetic interference (EMI) shielding.

BACKGROUND

Electronic units will often generate electromagnetic radiation during operation which can potentially interfere with the operation of other proximate electronic devices. This potential for EMI is especially problematic in automotive applications because it has the potential to compromise operation of a vehicle's electronic control units while they are performing safety critical operations. Consequently, it is necessary to ensure that automotive electronics, such as information head units and domain controllers, have electromagnetic compatibility (EMC) to ensure that they are isolated from external electromagnetic noise, whilst at the same time do not radiate electromagnetic fields which could affect other devices.

To meet the EMC requirements, automotive electronic devices are typically enclosed within die-cast metal EMI shielding housings, that form an electrically grounded barrier for absorbing electromagnetic radiation. Such housings will normally be provided in two separable parts for allowing the housing to be opened during assembly and to facilitate access to the device for subsequent maintenance. Accordingly, a second part of the housing will typically form a removable panel or cover that is secured by screws over the first part, with the parts fitting together at opposing interface surfaces. An resilient, electrically conductive EMI shielding gasket will also be provided between the interface surfaces to seal between the faces. In order for the shielding gasket to work effectively, it must be compressed within a specific compression range. However, in practice, the interface surfaces rarely mate together perfectly due to inherent manufacturing tolerances, casting defects and thermal differences. At the same time, the stiffness of the cover part is also often not sufficient to properly compress the gasket over the whole of the interface between the parts. These factors mean that the compression rates around the gasket are often uneven.

In this respect, FIG. 1 shows a isometric view of a conventional automotive EMC housing 1 having a base part 2 covered by a cover part 3 for enclosing a printed circuit board (PCB) 6. The cover 3 is shown with an exaggerated deformation scaled up by 20 times for illustration. As shown, the base and cover interface surfaces 4,5 diverge from one another in a number of areas, resulting in gaps in the enclosure. In these areas, the gasket provided between the interface surfaces may not be sufficiently compressed to within the desired compression range to form an effective EMI shield. As such, electromagnetic radiation may leak through or be emitted from the housing in these areas. Furthermore, the EMI shielding cannot be improved by further tightening the screw fixings securing the cover part 3 to the base part 2 because, although this helps to compress the parts together, its effectiveness is limited by the stiffness of the cover 3 and it also leads to higher forces being applied to the PCB 6. Accordingly, the loading across the PCB 6 can result in strains across the electronic components and interconnects, and ultimately have the potential to result in component failure or reliability issues.

To address the above, investigations have been made into new EMI shielding gaskets which are more compressible and therefore may provide a more uniform seal between parts of the EMC housing. For instance, more complex gasket shapes may be formed by moulding, die-cutting, or selective deposition dispensing processes. However, these more complex manufacturing techniques are largely impractical for automotive applications because they would have a significant detrimental impact on overall production time, leading to unacceptable increases in production costs.

There therefore remains a need to address the above issues with the related art.

SUMMARY

According to a first aspect, there is provided an electromagnetic compatibility, EMC, housing including: a first part and a second part for forming an enclosure when fitted together, wherein the first and second parts include first and second interface surfaces, respectively, for compressing a gasket interposed between the interface surfaces when the first and second parts are fitted together, and wherein at least one of the first and second interface surfaces includes a plurality of undercut regions for reducing compression of the gasket in the region when the first and second parts are fitted together.

In this way, the forces required to compress the gasket as a whole are reduced. At the same time, this may be achieved without needing to modify the gasket itself. Consequently, the gasket may be sufficiently compressed to achieve the required EMI shielding effect over its whole length, but without imposing excessive strain on the electronic components housed therein. As such, electromagnetic compatibility may be achieved, without increasing manufacturing or production costs.

In embodiments, the undercut regions are between 40-60% of the respective interface surface. In this way, the required forces to achieve sufficient compression for EMI shielding may be reduced by a proportionate amount.

In embodiments, the plurality of undercut regions form a pattern of undulations in the respective interface surface. In this way, a more uniform compression level may be achieved throughout the interface surfaces as a whole.

In embodiments, undercut regions are interspersed between projecting regions of the respective interface surface.

In embodiments, spacing between the projecting regions is between 5-20 mm, where the spacing defines undercut regions. In embodiments, the spacing between the projecting regions is between 6-14 mm.

In embodiments, the projecting regions are between 5-20 mm long. In embodiments, the projecting regions are between 6-14 mm long.

In embodiments, the EMC housing further includes the gasket. In embodiments, the gasket includes an electrically conductive elastomer material.

In embodiments, the gasket is deposited onto the first interface surface. In embodiments, a section of the gasket is dispensed onto the first interface surface.

In embodiments, the first interface surface is for compressing the gasket against the second interface surface when the first and second parts are fitted together.

In embodiments, the first interface surface is for compressing the gasket against a circuit board interposed between the interface surfaces when the first and second parts are fitted together. In this way, the gasket or a section of a gasket may form a resilient support for supporting a circuit board.

In embodiments, the EMC housing further includes a further gasket.

In embodiments, the second interface surface is for compressing the further gasket against a circuit board interposed between the interface surfaces when the first and second parts are fitted together.

In embodiments, the gasket is an Electromagnetic Interference, EMI, shielding gasket.

In embodiments, the housing is an automotive electronics housing.

In embodiments, the first part and the second part are configured to form an enclosure around an automotive electronic control unit when fitted together.

BRIEF DESCRIPTION OF DRAWINGS

An illustrative embodiment will now be described with reference to the accompanying drawings in which.

DETAILED DESCRIPTION

An illustrative embodiment is described with reference to FIGS. 2 to 8.

Figure 1:
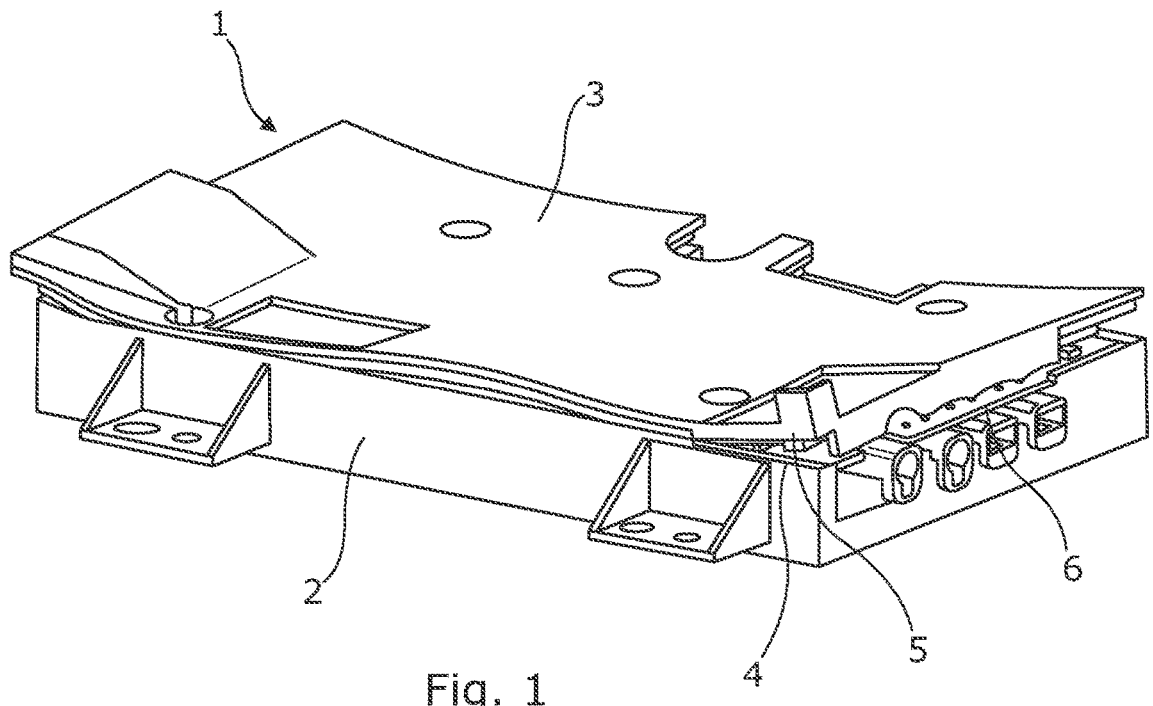
FIG. 1 shows a isometric view of a conventional automotive EMC housing with deformation of the cover part scaled up by 20 times.

As with the conventional housing shown in FIG. 1, the automotive EMC housing according to the illustrative first embodiment includes a base part 2 and a cover part 3 that are fitted together, with a gasket 9 interposed between, to form an assembled EMC housing.

Figure 2:
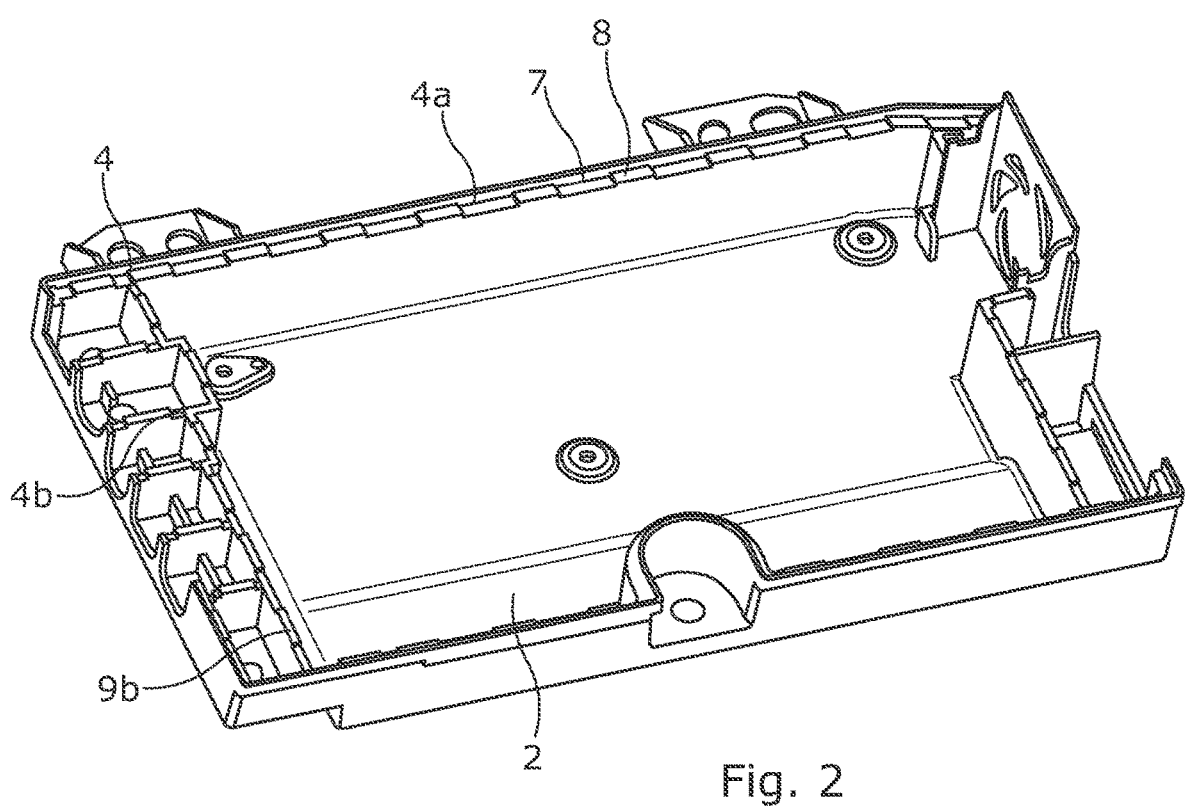
FIG. 2 shows a isometric view of a base part of an automotive EMC housing according to an illustrative embodiment.

FIG. 2 shows a isometric view of the base part 2 of the automotive EMC housing according to the illustrative embodiment. The base part 2 includes a first interface surface 4 which mates with a corresponding second interface surface 5 on the cover part 3, when the base and cover are fitted together. The first interface surface 4 includes two side sections 4a extending along the sides of the housing, and two end sections 4b extending along the ends of the housing. As is discussed in further detail below, both side and end sections of the first interface surface have a shaped surface profile in the form of flattened undulations extending along their lengths. In FIG. 2, these undulations are visible in the side interface surface sections 4a as projecting regions 8 interspersed with undercut regions 7. Corresponding undulations are formed on the end interface surface sections 4b, albeit that this is less visible in FIG. 2 because a second gasket section 9b has been deposited over them.

Figure 3:
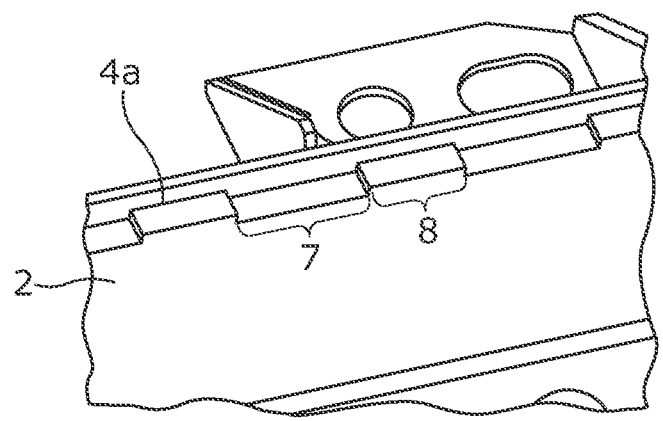
FIG. 3 shows an enlarged isometric view of a side interface surface section of the base part shown in FIG. 2.
Figure 4:
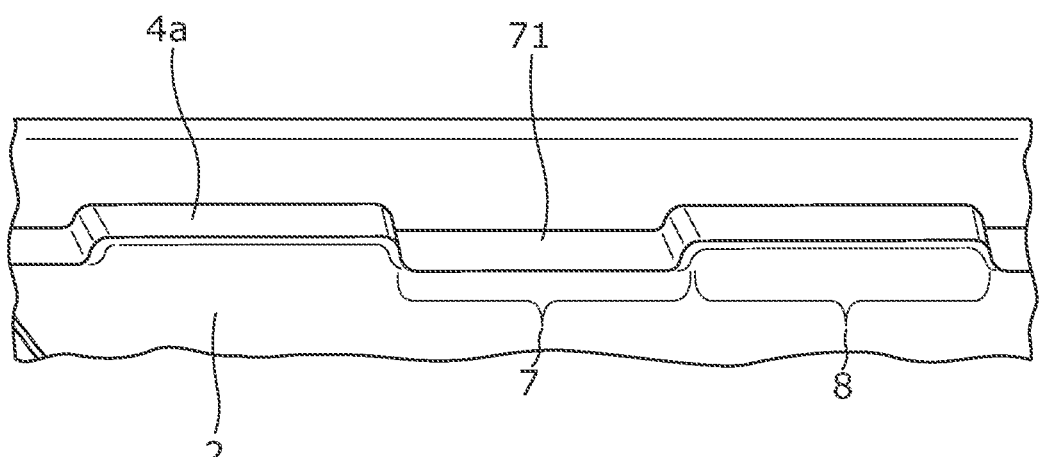
FIG. 4 shows an enlarged side view of the side interface surface section of the base part shown in FIG. 3.

Turning to the side interface surface sections 4a first, FIGS. 3 and 4 respectively show enlarged isometric and side views of one of the interface surfaces. The interface surface has an undulating profile with the flattened bases of undercut regions 7 being in a different plane to the plane of the flattened tops of the projecting regions 8. As such, a repeating pattern of projections and undercuts is provided, with spaces 71 being defined by the undercut regions 7, between the planes of these formations.

Figure 5:
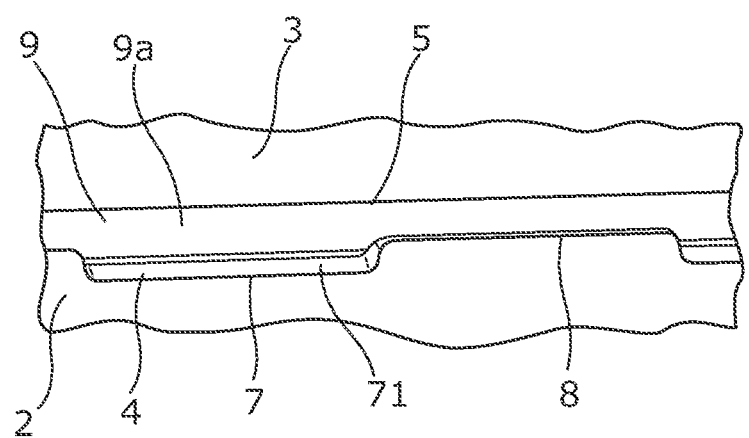
FIG. 5 shows an enlarged isometric view of the side interface surface section and gasket in the assembled EMC housing of the first embodiment.

In this connection, FIG. 5 shows an enlarged isometric view of a side interface surface section 4a and gasket 9 in the assembled EMC housing. The gasket 9 is formed as a elongate body of electrically conductive elastomer material, and the projecting regions 8 form a seat onto which the gasket 9 is seated. The spaces 71 formed by undercuts 7 provide an area for the adjacent regions of the gasket 9 to be moved into when the assembly is compressed. The side sections of the second interface surface 5 provided on the cover part 3 have a flat surface which is used to press the gasket 9 into the first interface surface 4. As such, in this first section of the gasket 9a, the projecting regions 8 of the first interface surface 4 will project into the gasket material when the base part 2 and cover part 3 are brought together by the screw fixtures. At the same time, although the gasket material will contact the surface of the undercut regions 7, the gasket material in these regions will be substantially uncompressed due to the space 71.

Figure 6:
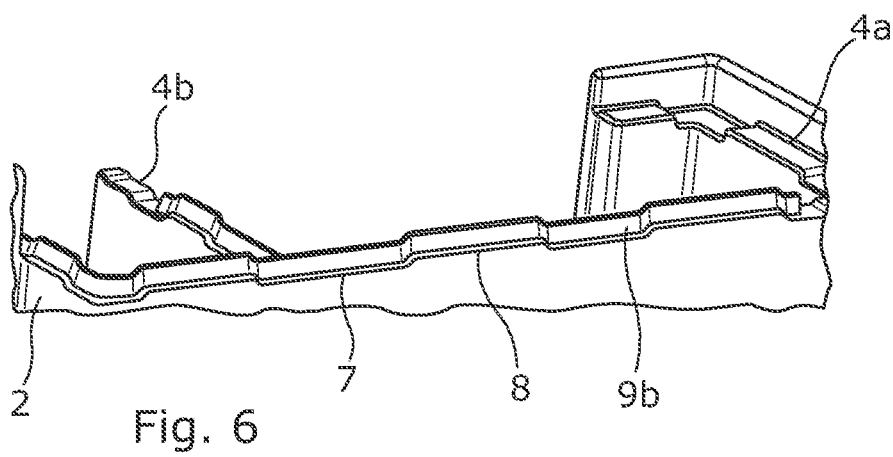
FIG. 6 shows an enlarged isometric view of an end interface surface section of the base part shown in FIG. 2.

FIG. 6 shows an enlarged isometric view of an end interface surface section 4b of the base part 2, which forms an elastic support for the PCB 6. In this respect, the end interface surface sections 4b have corresponding undulations to those provided in the side interface surface sections 4a, with the same repeating pattern of undercuts 7 and projecting regions 8. In this case, a second section of the gasket 9b is deposited directly onto the interface surface 4 of the base part 2, and forms a lower compressible support for the PCB 6. As shown, the second section of the gasket 9b adopts a corresponding undulating profile to the interface surface 4 onto which it is deposited, with the gasket 9b protruding in regions over the projecting regions 8 of the interface surface 4, and being recessed in in regions over the undercut regions 7 of the interface surface 4.

The end sections of the second interface surface 5 provided on the cover part 3 also have a corresponding undulated profile to that provided on the end sections of the first interface surface 4b shown in FIG. 6. That is, in contrast to the flat side sections of the second interface surface 5, the end sections of this surface are provided with a pattern of projecting regions 8 and undercut regions 7. At the same time, a second gasket 10 is also deposited directly onto this second interface surface 5 to produce a corresponding undulating profile for forming an upper compressible support for the PCB 6. The end sections of the first and second interface surfaces 4,5 therefore largely mirror one another, albeit that the positions of the projecting and undercut regions do not need to match precisely.

Figure 7:
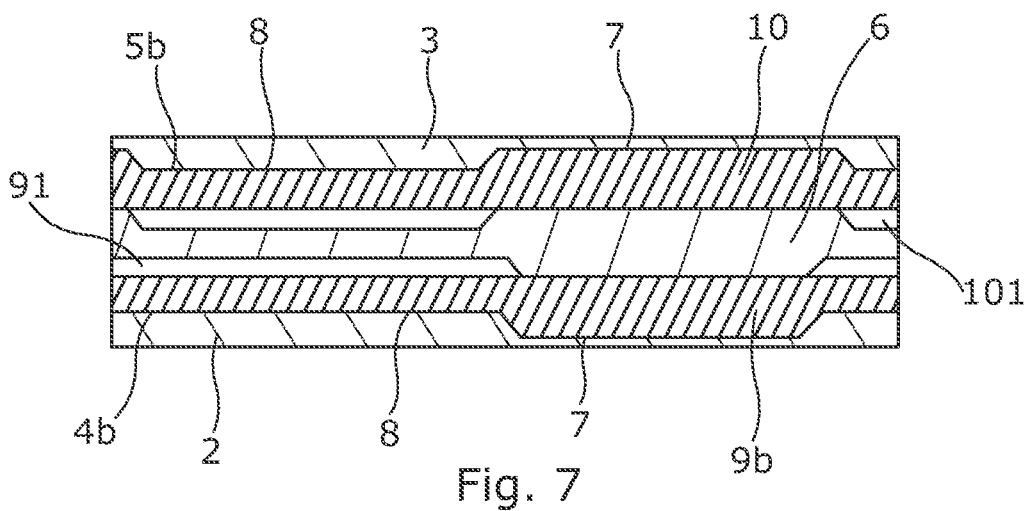
FIG. 7 shows an enlarged side view of the end sections of the interface surfaces and gaskets in the assembled EMC housing of the first embodiment.

FIG. 7 shows an enlarged side view of the end sections 4b, 5b of the interface surfaces and gaskets 9, 10 in the assembled EMC housing of the first embodiment. The PCB 6 is sandwiched between the gaskets 9, 10, with the regions of the gaskets 9, 10 associated with the projecting regions of the first and second interface surfaces forming compressed regions 91, 101. As such, the gaskets 9,10 are compressed into the PCB 6 by the respective interface surfaces, which acts to clamp the PCB 6 in place. As the PCB 6 is resiliently held between the gaskets 9, 10, the forces and strain applied across the PCB 6 are also minimised, thereby mitigating the risk of damage to the PCB 6.

Figure 8:
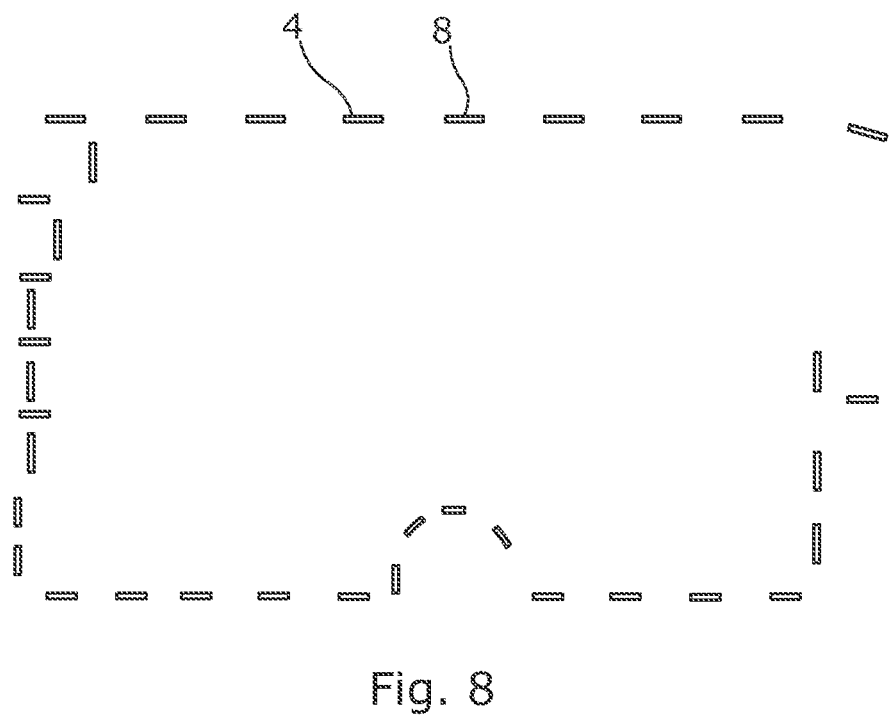
FIG. 8 shows a plan view of the projected compression regions of the gasket in the EMC housing of the first embodiment.

FIG. 8 shows a plan view of the projecting regions of the gasket 6 in the EMC housing of the first embodiment. As shown, the total length of the gasket that is substantially compressed when the housing is closed is reduced. In this embodiment, each projecting region 8 is 10 mm long, interspersed by a 10 mm undercut region. Consequently, the length of gasket that is compressed is effectively reduced by around 50%. It will however be understood that the length and spacing between the projecting regions 8 and undercut regions 7 may be adjusted to optimise the amount of compression. Advantageously, as the undercut regions 7 result in discontinuities in the compressed gasket regions, the force required to compress the gasket 9 is reduced. This thereby allows higher levels of compression to be achieved in the gasket, with compression within the desired range being more uniformly achieved around the whole interface between the parts 2, 3. At the same time, the discontinuities do not compromise the EMI shielding performance of the gasket. In addition, the lower compression forces mean that the PCB 6 is subjected to lower loads. Furthermore, production costs are also not substantively increased because basic gasket manufacturing techniques can still be used. That is, it is not necessary to modify the deposition or moulding process to achieve a complex gasket shape to increase compression. Instead, the moulds used to die cast the housing parts may simply be configured to include the desired interface surface profiles, with those surface profiles being used to adjust the compressibility across the gasket.

It will be understood that the embodiment illustrated above shows an application only for the purposes of illustration. In practice, embodiments may be applied to many different configurations, the detailed embodiments being straightforward for those skilled in the art to implement.

The invention claimed is:

1. An electromagnetic compatibility, EMC, housing comprising:
 a first part and a second part for forming an enclosure when fitted together,
 wherein the first and second parts comprise first and second interface surfaces, respectively, for compressing a gasket interposed between the first and second interface surfaces when the first and second parts are fitted together,
 and wherein at least one of the first and second interface surfaces comprises projecting regions for seating the gasket and a plurality of undercut regions for reducing compression of the gasket in the region when the first and second parts are fitted together, the undercut regions disposed adjacent to each of the projecting regions forming spaces such that upon compression of the gasket, a portion of the gasket contacts the undercut regions.

2. An EMC housing according to claim 1, wherein the undercut regions are between 40-60% of the respective interface surface.

3. An EMC housing according to claim 1, wherein the plurality of undercut regions form a pattern of undulations in the respective interface surface.

4. An EMC housing according to claim 1, wherein the undercut regions are interspersed between projecting regions of the respective interface surface.

5. An EMC housing according to claim 4, wherein spacing between the projecting regions is between 5-20 mm, where the spacing defines undercut regions.

6. An EMC housing according to claim 4, wherein the projecting regions are between 5-20 mm long.

7. An EMC housing according to claim 1, further comprising the gasket.

8. An EMC housing according to claim 7, wherein the gasket is dispensed onto the first interface surface.

9. An EMC housing according to claim 1, wherein the first interface surface is for compressing the gasket against the second interface surface when the first and second parts are fitted together.

10. An EMC housing according to claim 1, wherein the first interface surface is for compressing the gasket against a circuit board interposed between the interface surfaces when the first and second parts are fitted together.

11. An EMC housing according to claim 1, further comprising a further gasket.

12. An EMC housing according to claim 11, wherein the second interface surface is for compressing the further gasket against a circuit board interposed between the interface surfaces when the first and second parts are fitted together.

13. An EMC housing according to claim 1, wherein the gasket is an Electromagnetic Interference, EMI, shielding gasket.

14. An EMC housing according to claim 1, wherein the housing is an automotive electronics housing.

15. An EMC housing according to claim 14, wherein the first part and the second part are configured to form an enclosure around an automotive electronic control unit when fitted together.

* * * * *